(12) United States Patent  
Neyret et al.

(10) Patent No.: US 7,749,910 B2
(45) Date of Patent: Jul. 6, 2010

(54) METHOD OF REDUCING THE SURFACE ROUGHNESS OF A SEMICONDUCTOR WAFER

(75) Inventors: Eric Neyret, Sassenage (FR); Ludovic Ecarnot, Varces (FR); Christophe Maleville, La Terrasse (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 1323 days.

(21) Appl. No.: 11/189,849

(22) Filed: Jul. 27, 2005

(65) Prior Publication Data

US 2006/0035445 A1   Feb. 16, 2006

Related U.S. Application Data

(63) Continuation-in-part of application No. 10/750,443, filed on Dec. 30, 2003, now Pat. No. 6,962,858, which is a continuation of application No. PCT/FR02/02341, filed on Jul. 4, 2002, application No. 11/189,849, which is a continuation-in-part of application No. PCT/IB03/06351, filed on Dec. 3, 2003.

(30) Foreign Application Priority Data

Jul. 4, 2001   (FR) .................................. 01 08859

(51) Int. Cl.  
*H01L 21/302*   (2006.01)

(52) U.S. Cl. ........................ 438/697; 438/749; 438/752; 438/753; 438/795

(58) Field of Classification Search ................. 438/308, 438/697, 749, 752, 753, 795  
See application file for complete search history.

(56) References Cited

U.S. PATENT DOCUMENTS

| 5,374,564 | A | 12/1994 | Bruel .......................... 437/24 |
| 5,403,406 | A | 4/1995 | Falster et al. ................ 148/33.2 |
| 5,738,909 | A | 4/1998 | Thakur et al. ............. 427/255.4 |
| 5,741,717 | A | 4/1998 | Nakai et al. ................. 438/766 |
| 5,856,027 | A | 1/1999 | Murphy ...................... 428/623 |

(Continued)

FOREIGN PATENT DOCUMENTS

EP   1 061 565 A   12/2000

(Continued)

OTHER PUBLICATIONS

Chinese Counterpart Notification from State Intellectual Property Office of P.R. China for Appln. No. 200380110782.4.

*Primary Examiner*—Binh X Tran  
(74) *Attorney, Agent, or Firm*—Winston & Strawn LLP (57) ABSTRACT

The invention provides a method for reducing the roughness of a free surface of a semiconductor wafer that includes removing material from the free surface of the wafer to provide a treated wafer, and performing a first rapid thermal annealing on the treated wafer in a pure argon atmosphere to substantially reduce the roughness of the free surface of the treated wafer. The material removal is selected and conducted to improve the effectiveness of the subsequent rapid thermal annealing in reducing the roughness of the free surface of the treated wafer.

20 Claims, 3 Drawing Sheets

U.S. PATENT DOCUMENTS

| | | | |
|---|---|---|---|
| 5,904,491 A | 5/1999 | Ojha et al. | 438/31 |
| 5,932,022 A * | 8/1999 | Linn et al. | 438/795 |
| 5,966,625 A | 10/1999 | Zhong et al. | 438/492 |
| 6,171,965 B1 | 1/2001 | Kang et al. | 438/695 |
| 6,372,609 B1 | 4/2002 | Aga et al. | 438/459 |
| 6,376,395 B2 | 4/2002 | Vasat et al. | 451/41 |
| 6,391,662 B1 | 5/2002 | Mule'Stagno et al. | 438/8 |
| 6,403,450 B1 * | 6/2002 | Maleville et al. | 438/471 |
| 6,492,682 B1 | 12/2002 | Akiyama et al. | 527/347 |
| 6,566,255 B2 | 5/2003 | Ito | 38/660 |
| 6,573,159 B1 | 6/2003 | Kobayashi et al. | 438/471 |
| 6,577,386 B2 | 6/2003 | Yoshida et al. | 356/123 |
| 6,589,609 B1 | 7/2003 | Pan et al. | 427/554 |
| 6,680,260 B2 | 1/2004 | Akiyama et al. | 438/766 |
| 6,809,015 B2 | 10/2004 | Kobayashi et al. | 438/540 |
| 6,846,718 B1 | 1/2005 | Aga et al. | 438/406 |
| 6,858,508 B2 | 2/2005 | Ito | 38/311 |
| 6,903,032 B2 | 6/2005 | Maleville et al. | 438/796 |
| 6,962,858 B2 | 11/2005 | Neyret et al. | 438/471 |
| 2002/0004305 A1 * | 1/2002 | Vasat et al. | 438/690 |
| 2002/0058387 A1 * | 5/2002 | Ito | 438/308 |
| 2002/0127766 A1 | 9/2002 | Ries et al. | 438/94 |
| 2002/0174879 A1 * | 11/2002 | Chen | 134/3 |
| 2003/0030147 A1 | 2/2003 | Herner et al. | 257/768 |
| 2004/0171257 A1 | 9/2004 | Neyret et al. | 438/689 |
| 2006/0024908 A1 | 2/2006 | Neyret et al. | 438/398 |
| 2006/0035445 A1 | 2/2006 | Neyret et al. | 438/472 |

FOREIGN PATENT DOCUMENTS

| | | |
|---|---|---|
| EP | 1 137 069 | 9/2001 |
| FR | 2797713 | 2/2001 |
| FR | 2 827 423 A | 1/2003 |
| JP | 0732104 A | 12/1995 |
| WO | WO03005434 A2 | 1/2003 |
| WO | WO 2003009366 | 1/2003 |

* cited by examiner

METHOD OF REDUCING THE SURFACE ROUGHNESS OF A SEMICONDUCTOR WAFER

CROSS-REFERENCE TO RELATED APPLICATIONS

This application is a continuation-in-part of U.S. application Ser. No. 10/750,443, filed on Dec. 30, 2003, now U.S. Pat. No. 6,962,858, which is a continuation of International Application PCT/FR02/02341, filed on Jul. 4, 2002. This application is also a continuation-in-part of International Application PCT/IB2003/06351, filed on Dec. 3, 2003. The entire contents of each of the above-referenced applications are expressly incorporated herein by reference thereto.

FIELD OF THE INVENTION

The present invention relates to a method for treating a semiconductor wafer. More particularly, the invention relates to treating the surface of a semiconductor wafer by annealing.

BACKGROUND OF THE INVENTION

The present invention generally relates to the surface treatment of semiconductor materials, and in particular to treating substrates for fabricating components for microelectronic and/or optoelectronic applications. More precisely, the invention concerns a method of reducing the roughness of the free surface of a semiconductor wafer that includes an annealing step to smooth the free surface.

The term "free surface" means the surface of a wafer which is exposed to the external environment (in contrast to an interface surface which is in contact with the surface of another wafer or some other element).

As explained below, the invention can be implemented in a particularly advantageous, but non-limiting manner, in combination with a method of fabricating thin films or layers of semiconductor material of the type described in U.S. Pat. No. 5,374,564. A method that uses the teaching of the above-cited document is known as the Smart-Cut® method. In outline, its main steps are as follows: implanting atoms beneath a face of a semiconductor substrate (in particular silicon) in an implantation zone of the substrate, bonding the implanted substrate onto a stiffener substrate by intimate contact, and detaching the implanted substrate in its implantation zone, or zone of weakness, to transfer the portion of the substrate that is situated between the surface that was subjected to implantation and the implantation zone to the stiffener, to form a thin film or semiconductor layer thereon.

The term "implanting" atoms means any bombardment of atomic species, including molecular and ionic species, suitable for introducing the species into the material of the wafer, with the implanted species having a concentration maximum at a predetermined depth within the wafer relative to the bombarded surface, so as to define a zone of weakness. The depth of the zone of weakness is a function of the nature of the implanted species and the implantation energy associated therewith. In this text, the generic term "wafer" may be used to designate the film or layer transferred by such a Smart-Cut® type method. The wafer (which is made of semiconductor material) can thus be associated with a stiffener, and possibly also with other intermediate layers.

The term "wafer" is also used in the present text to mean any wafer of semiconductor material such as silicon, regardless of whether or not the wafer has been produced by a Smart-Cut® type method, the object being in all cases to reduce the roughness of the free surface of the wafer. For applications of the type mentioned above, the roughness specifications associated with the free surfaces of wafers are very severe and critical, and the quality of the wafer's free surface is a parameter which determines the quality of components to be made on the wafer. It is thus common to find roughness specifications that must not exceed 5 angstroms (Å) in root mean square (rms) value.

Roughness measurements are generally performed using an atomic force microscope (AFM). Roughness is measured on surfaces that are scanned by the tip of the AFM microscope, covering areas in the range 1 µm×1 µm to 10 µm×10 µm, and sometimes 50 µm×50 µm, or even 100 µm×100 µm.

Roughness may be characterized in two ways. First, the roughness can be described as a "high frequency" roughness and corresponds to scanning areas of about 1 µm×1 µm. Second, the roughness is a "low frequency" roughness when scanning corresponds to scanning areas of about 10 µm×10 µm or greater. The 5 Å specification example given above is thus for roughness corresponding to a scan area of 10 m×10 µm.

Wafers produced by known methods (such as the Smart-Cut® type or other layer detachment methods) present surface roughnesses of values that are greater than the specifications of the magnitude specified above, unless the surface of the wafer is subjected to a specific treatment, such as polishing. A first known method for reducing the surface roughness of wafers consists of subjecting the wafer to "conventional" heat treatment (e.g. sacrificial oxidation). However, such treatment does not decrease the roughness of wafers down to the level of the above-mentioned specifications. In order to further reduce roughness, it is possible to envision increasing the number of applications of conventional heat treatments and/or combining them with other known methods. But such techniques lead to a method that is lengthy and complex. For example, U.S. Pat. No. 6,573,159 discloses a lengthy annealing process (about 60 minutes) at high temperature, followed by cooling under an atmosphere containing hydrogen.

A second known method consists of subjecting the free surface of the wafer to chemical-mechanical polishing. This method can indeed reduce the roughness of the free surface of the wafer. However, if a defect concentration gradient that increases towards the free surface of the wafer exists, this second method can also abrade the wafer down to a zone that presents an acceptable concentration of defects. But this second known method can compromise the uniformity of the free surface of the wafer. This drawback is worsened when a large amount of polishing is performed on the surface of the wafer, as would be necessary to reach the roughness levels mentioned above.

A third known method consists of subjecting the wafer to rapid annealing under a controlled atmosphere, known as rapid thermal annealing (RTA). In this text, this form of annealing is referred to either by its acronym RTA or in full as "rapid thermal annealing."

In this third method, the wafer is annealed at high temperature, which may lie in the range of about 1100° C. to 1300° C., for a period of 1 second to 60 seconds. In a first variant of this third type of method, an example of which is to be found in U.S. Pat. No. 6,171,965, the free surface is smoothed by performing RTA of the wafer under an atmosphere consisting of a mixture generally comprising hydrogen in combination with reagent gases (HCl, HF, HBr, $SF_6$, $CF_4$, $NF_3$, $CCl_2F_2$, etc.). In this first variant of the third method, the aggressive nature of the mixture constituting the annealing atmosphere enables the free surface of the wafer to be "etched", thereby reducing its roughness. Although this first variant can present certain advantages, the aggressive nature of the mixture of gases of the atmosphere limits the use of such a method, and elements other than the free surface of the wafer may be exposed to the action thereof (the face of the wafer or the structure to which it is bonded that faces away from the free surface of the wafer may also be detrimentally affected and sometimes also the annealing chamber may be detrimentally affected). It can thus be necessary to take additional measures to protect those elements, which tends to make the method even more complex. The aggressive nature of the mixture that is used can, under some circumstances, also worsen defects in the wafer, resulting in the wafer requiring additional treatments. Furthermore, use of an annealing atmosphere made up of different gases, some of which are reactive, requires providing an installation for implementing such a method that can be relatively complex (feeds for different gases, safety measures and the like).

An implementation taught in U.S. Pat. No. 6,573,159 corresponds to the first variant of the third type of method. In that implementation, RTA is performed in an atmosphere that always contains hydrogen. In a second variant of the third type of method, the wafer is subjected to RTA under an atmosphere that does not attack the material of the wafer. Smoothing results not from etching the free surface of the wafer, but from rebuilding the surface of the wafer. In that case, the annealing atmosphere is typically made up of hydrogen mixed with argon or nitrogen. PCT application WO01/15215 in the name of SOITEC Silicon-On-Insulator Technologies, S.A. discloses an example of the second variant of the third type of method.

U.S. Pat. No. 6,846,718 discloses a finishing treatment that always comprises two annealing operations, including one RTA operation. The annealing operations are performed in an atmosphere containing hydrogen or argon. The two disclosed annealing operations both smooth the free surface of the wafer. The reduction in low frequency roughness is illustrated by the last column of Table 2 in that document, which shows in particular the effect of the second annealing operation following the RTA operation. With RTA treatment alone ("comparative example 1"), low frequency roughness after treatment is in nanometers (nm) rms. By implementing the two annealing operations as described in that document, the low frequency roughness is significantly improved, reaching values of 0.28 nm rms and 0.30 nm rms. The teaching is thus focused on performing two successive operations of smoothing by annealing (where smoothing is characterized by a reduction in low frequency roughness), with the first of those two annealing operations being RTA. However, the method taught in U.S. Pat. No. 6,846,718 is relatively lengthy and expensive to implement since it always requires two annealing operations for smoothing.

The present invention seeks to provide an improvement to the methods mentioned above by further simplifying such methods. In addition, it would also be advantageous to reduce any slip lines that can appear in the crystallographic structure of the material of the wafer, in particular as a result of heat treatment (such as that which might be applied to the wafer in order to detach it when performing a Smart-Cut® type method). It is known that such slip lines can result from heating different regions of the wafer in a non-uniform manner (this is particularly troublesome in furnaces presenting cold spots). There is also a need for a method of reducing the roughness of a free surface of a wafer such that the homogeneity of the roughness over the free surface is preserved. Furthermore, hydrogen used in the prior art implementations is a gas that is relatively expensive, and there is a continuous effort to reduce the costs associated with wafer treatment methods. Finally, it would be particularly advantageous to be able to implement a method satisfying the above-mentioned objects in combination with the use of a Smart-Cut® type method.

SUMMARY OF THE INVENTION

The present invention relates to a method for reducing the roughness of a free surface of a semiconductor wafer. The preferred embodiment includes removing material from the free surface of the wafer to provide a treated wafer, and performing a first rapid thermal annealing on the treated wafer in a pure argon atmosphere to substantially reduce the roughness of the free surface of the wafer. The material removal is selected and conducted to improve the effectiveness of the subsequent rapid thermal annealing in reducing the roughness of the free surface of the treated wafer. Preferably, the first rapid thermal annealing is performed as single treatment at a temperature of between about 1000° C. and about 1400° C. The first rapid thermal annealing is preferably performed for about 1 second to about 60 seconds.

Material is preferably removed from the free surface by performing at least a polishing, chemical cleaning, or a combination thereof. In a preferred embodiment where material is removed by chemical cleaning, the free surface of the wafer is preferably cleaned to reduce the amount of pollutants thereon before performing the first rapid thermal annealing on the treated wafer in the pure argon atmosphere. More preferably, the chemical cleaning is performed immediately before placing the wafer in an annealing chamber for performing rapid thermal annealing.

Preferably, the chemical cleaning is an RCA cleaning that includes treating the wafer in two successive chemical baths. The first bath preferably includes an aqueous solution of ammonium hydroxide and hydrogen peroxide. More preferably, the first bath includes ammonium hydroxide and hydrogen peroxide both in concentrations between about 0.5% and about 10% based on molecular weight. Where the free surface of the wafer includes silicon, the first bath preferably includes ammonium hydroxide and hydrogen peroxide in concentrations, respectively, of about 1% and about 2% based on molecular weight.

The second bath preferably includes an aqueous solution of hydrogen chloride and hydrogen peroxide. More preferably, the second bath includes hydrogen chloride and hydrogen peroxide both in concentrations between about 0.05% and about 10% based on molecular weight. Where the free surface of the wafer includes silicon, the second bath preferably includes hydrogen chloride and hydrogen peroxide both in concentrations of about 1% based on molecular weight.

The first and second baths have a temperature preferably of between about 10° C. and about 100° C. Where the free surface of the wafer includes silicon, the first and second baths preferably have a temperature of between about 60° C. and about 80° C.

The chemical cleaning can also include an HF cleaning that includes treating the wafer in an HF bath that preferably has a concentration of HF between about 0.1% and about 50% based on molecular weight. Preferably, the HF bath has a temperature of between about 15° C. and about 25° C. The wafer also preferably is a silicon-on-insulator wafer or a silicon-germanium-on-insulator wafer having a silicon germanium surface layer that comprises less than about 30% germanium.

The preferred embodiment preferably further includes implanting atomic species in a donor substrate to form a region of weakness therein, bonding a handle substrate to the donor substrate to form a bonded structure such that the region of weakness defines on opposite sides thereof the semiconductor wafer and another portion of the bonded structure, wherein the semiconductor wafer comprises the handle substrate and a transfer layer of the donor substrate, and applying energy at the region of weakness to detach the semiconductor wafer from the other portion to provide the free surface on the transfer layer. Preferably, the free surface of the transfer layer is chemically cleaned to substantially eliminate or reduce pollutants thereon.

The preferred embodiment also preferably includes establishing a first atmosphere in an annealing chamber, replacing the first atmosphere with a second atmosphere that comprises a gas selected to eliminate or substantially reduce pollutants on the wafer, and exposing the free surface of the wafer to the second atmosphere to eliminate or substantially reduce pollutants thereon. The method then includes replacing the second atmosphere with the pure argon atmosphere, and performing rapid thermal annealing on the wafer in the pure argon atmosphere to substantially reduce the roughness of the free surface of the wafer. Preferably, the second atmosphere comprises a mixture of gases comprising argon and at least one secondary gas. More preferably, the secondary gas comprises at least one of hydrogen and hydrogen chloride.

The preferred embodiment can also preferably include removing material from the free surface by performing at least a first sacrificial oxidation treatment. Preferably, the first sacrificial oxidation treatment includes heating the wafer in an oxygen atmosphere to form an oxide layer on the free surface of the wafer, performing a heat treatment step to cure defects on the free surface of the wafer, and removing at least a portion of the oxide layer from the free surface of the wafer.

The preferred embodiment further includes performing a second sacrificial oxidation treatment on the treated wafer after performing the first rapid thermal annealing. Additionally, the method preferably includes performing a second rapid thermal annealing on the treated wafer after performing the first rapid thermal annealing, and polishing the free surface of the treated wafer. Preferably, the polishing can be performed before or after the first or second rapid thermal annealing.

The invention thus provides an improved method of reducing the surface roughness of a wafer that also results in a homogeneous distribution of such roughness over the surface of the wafer.

DETAILED DESCRIPTION OF THE PREFERRED EMBODIMENTS

Figure 1:
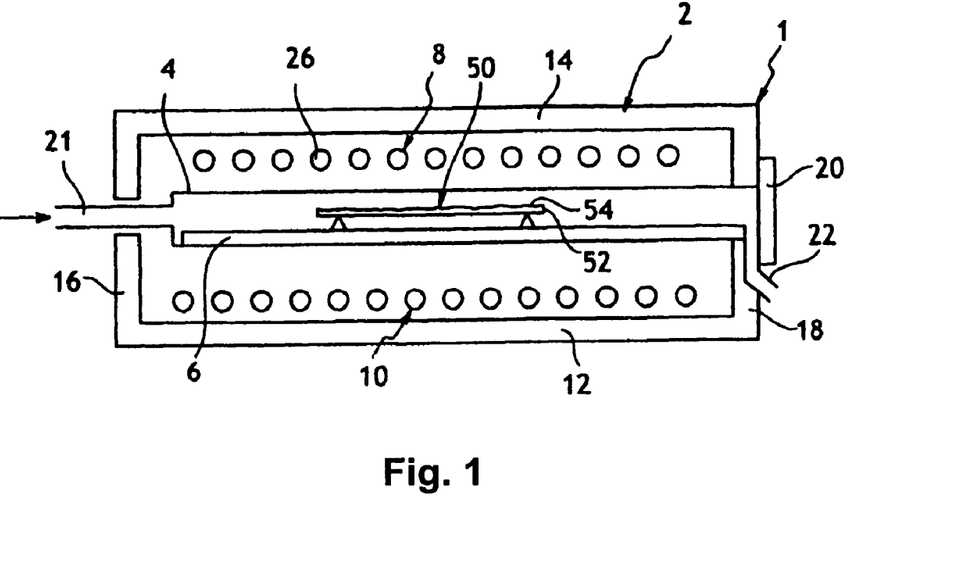
FIG. 1 is a side view of an embodiment of an annealing chamber used in the present invention.

FIG. 1 is a non-limiting example of an annealing chamber 1 that enables the invention to be implemented. The chamber is used to implement an annealing stage under a pure argon atmosphere using the RTA technique.

In this implementation, the chamber 1 preferably includes an enclosure 2, a reactor 4, a substrate-carrier tray 6, two arrays of halogen lamps 8, 10, and two opposed pairs of side lamps (not shown). The enclosure 2 also includes a bottom wall 12, a top wall 14, and two side walls 16,18 situated at respective longitudinal ends of the enclosure 2. One of the side walls 16,18 includes a gate 20. The reactor 4 preferably includes a quartz tube extending longitudinally between the two side walls 16, 18. A gas inlet 21 and a gas outlet 22 are provided at the respective side walls 16 and 18. The gas outlet 22 is preferably situated in the side wall 18 that has the gate 20. The arrays 8,10 of halogen lamps are preferably situated above and below the reactor 4, respectively, and between the reactor and the top 14 and bottom 12 walls. Each array 8,10 of halogen lamps preferably includes seventeen lamps 26 disposed perpendicular to the longitudinal axis of the reactor 4.

The two pairs of side lamps (not shown in FIG. 1) are preferably situated parallel to the longitudinal axis of the reactor 4, each on one side thereof, generally at the ends of the lamps 26 in the arrays 8,10 of halogen lamps. The substrate-carrying tray 6 slides inside the reactor 4. It supports a wafer 50 that is to be subjected to an annealing stage, and enables wafers to be inserted, preferably one at a time, into and removed from the chamber 1. An example of a chamber 1 of this type is sold by Steag under the name SHS AST 2800.

The "wafer" 50 may be made of, in general, any single-layer or multi-layer structure having a surface layer of semiconductor material (such as silicon, which is preferred but other types of semiconductor material could be used). The present technique can be used to reduce the roughness of the free surface of a wafer 50 that has not been subjected to any prior treatment, and may also be used with wafers that have been obtained by using specific treatments. In particular, different variants of the present method may be applied in particularly advantageous ways to reducing the roughness of the surface of a silicon-on-insulator (SOI) structure and/or of a substrate of semiconductor material from which such a structure is obtained, in particular, by applying a method such as the Smart-Cut® type method.

In the context of the Smart-Cut® method, the present method of performing an RTA to reduce the roughness of free surfaces of a wafer can advantageously be implemented on one or both of the two free surfaces of semiconductor material obtained by detaching a wafer along a zone of weakness made during an implantation step, or for reducing the roughness of both surfaces. Preferably, the region of weakness is made by implantation of atomic species in a donor substrate. The implantation of atomic species can include any suitable bombardment of atomic species, including molecular or ionic species, which can introduce the species through a surface with a maximum concentration of the species located at a predetermined depth from the surface. Suitable methods of atomic species implantation include using an ion beam implanter or a plasma immersion implanter. Preferably, the implanted atomic species are hydrogen ions. Other ionic species can advantageously be used alone or in combination with hydrogen, such as rare gases (for example helium) or other noble gases.

The donor substrate, which includes the region of weakness, is preferably bonded to a handle substrate to form a bonded structure. The region of weakness preferably defines, on opposite sides of the bonded structure, the semiconductor wafer and another portion of the bonded structure. The semiconductor wafer preferably includes the handle substrate and a transfer layer of the donor substrate. Energy is then applied to the bonded structure at the region of weakness to detach the semiconductor wafer from the other portion of the bonded structure to provide the free surface on the transfer layer. The different variant implementations of the present method described below by way of example are applied to treating wafers 50 having a useful layer of semiconductor material 52 (e.g. made of silicon), the layer itself having a free surface 54.

The layer 52 is termed "useful" since it is to be used for making electronic, optical, or optoelectronic elements on the wafer 50. As mentioned above, the free surface 54 may be a surface obtained by detaching a wafer from a substrate by implementing a Smart-Cut® method. When the wafer 50 is an SOI substrate obtained by the Smart-Cut® method, the wafer 50 preferably includes a buried oxide layer beneath the useful layer 52 that covers a supporting or stiffening substrate. It should be understood that in FIG. 1 the thickness of the wafer 50 has been exaggerated in order to show the useful layer 52 and its free surface 54.

The present method can be implemented by solely performing an RTA stage on the wafer 50 under an atmosphere of a pure gas selected to reduce the roughness of the free surface of the wafer. Preferably, the gas is a noble gas, and more preferably the gas is pure argon. The stage of annealing under pure argon preferably comprises the following steps: placing the wafer 50 in the chamber 1, with the chamber being cold when the wafer is inserted, introducing an annealing atmosphere of pure argon into the chamber at a pressure equal to or close to atmospheric pressure (it should also be understood that this pressure could also be set at a lower value, lying in the range of about 3 to 10 millitorr to atmospheric pressure), switching on the halogen lamps 26 so as to cause the temperature inside the chamber 1 to rise at a rate preferably at least about 40° C. per second and at most about 60° C. per second, and more preferably at a rate of at least about 5° C. per second, up to a treatment temperature, maintaining the wafer 50 in the chamber 1 throughout the duration of a high-temperature dwell, and switching off the halogen lamps 26 and cooling the wafer 50 by means of a flow of air at a rate of several tens of degrees Celsius per second, preferably at a rate of at least about 20° C. per second, with temperature varying in application of any desired relationship.

It is particularly important for the argon to be as pure as possible since it has been found that the presence of small quantities of additional elements (such as oxygen, in particular) can lead to the material of the useful layer being attacked. For example, the material may be attacked by highly volatile SiO if a surface area of silicon is exposed to an annealing atmosphere that includes a small quantity of oxygen. It has been found that such an annealing stage under an atmosphere of pure argon significantly decreases the roughness of the free surface 50. In particular, the results obtained were of much better quality than the reduction in roughness that can be obtained solely by conventional treatment such as a sacrificial oxidation-type heat treatment. The uniformity of the useful layer is also superior to that of subjected to a polishing operation.

The RTA stage under pure argon may comprise, for example, a high temperature dwell having a duration of about 1 second to 60 seconds, and in particular from about 5 seconds to 30 seconds, and a treatment temperature lying in the range of about 1000° C. to 1400° C., and in particular between about 1100° C. to 1250° C.

Figure 2:
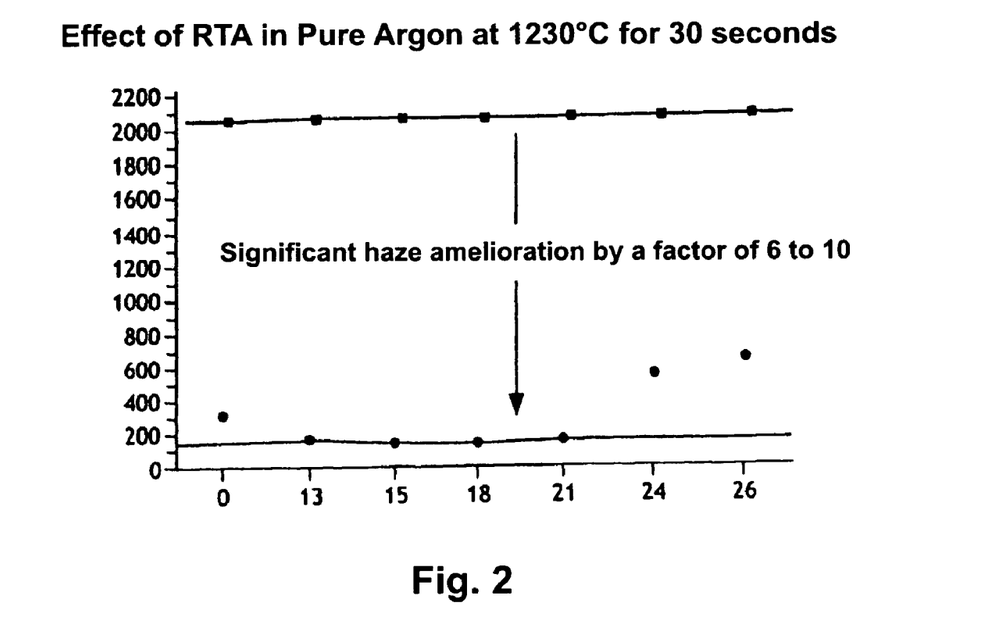
FIG. 2 is a graph illustrating the mean surface roughness of a wafer after RTA according to an embodiment of the present invention.

FIG. 2 shows the reduction in roughness obtained by RTA in a pure argon atmosphere. More precisely, this figure sets out the improvement in "haze" obtained by applying the present method as described above. In FIG. 2, the abscissa axis relates to different wafers, with haze being measured for each wafer before applying the annealing stage (top measurement) and after application of the annealing stage (bottom measurement). The top curve thus corresponds to haze as measured at the surface of SOI structures after they have been detached, and the bottom curve relates to the same measurements performed after RTA under argon at 1230° C. with a high temperature dwell of 30 seconds. The term "haze" designates the optical signal diffused by the surface of the substrate 50 in response to excitation by light, and is representative of surface roughness. This characteristic which is representative of the surface roughness of the substrate was measured in the present case using equipment of the KLA Tencor type, and of the Surfscan 6220® model, and thus the haze as measured is labeled as "HAZE 6220". As shown, the amount of reduction in HAZE 6220 is comparable to the results that can be obtained by other RTA techniques, for example RTA under an atmosphere made of a mixture of hydrogen and argon. More precisely, the improvement in the haze corresponds to haze being cut by a factor of about 6 to 10. Advantageously, implementing the present method makes it possible to obtain results with a high level of quality while avoiding the limitations mentioned above relating to prior RTA techniques. In particular, since argon is an excellent conductor of heat, using an atmosphere of pure argon enables heat to be spread in a manner that is as uniform as possible inside the chamber 1, thereby reducing the slip lines that occur when implementing prior art methods.

As mentioned above, the invention can be implemented solely by using a RTA stage under pure argon, which makes it possible to obtain a considerable improvement in the surface state of the wafer 50. In addition, this improvement is obtained with practically no material being removed from the wafer, but on the contrary with the surface 54 being rebuilt and smoothed.

Several variant implementations of the present method are described below involving not only a RTA stage under pure argon, but also additional treatment stages. In a first variant, the RTA stage using pure argon is followed by a stage of polishing the surface of the wafer 50. This polishing stage may be implemented by using conventional chemical-mechanical polishing. It removes material from the working layer 52 situated close to the free surface 54 that might still contain surface defects.

In a second variant, the RTA stage using pure argon is followed not only by a polishing stage, but also by a subsequent sacrificial oxidation stage combined with heat treatment. The sacrificial oxidation stage reduces any defects that might remain after the preceding stage. When implementing the invention after a Smart-Cut® method, defects may be associated with the implanting stage or the detachment stage. The sacrificial oxidation stage includes an oxidation step and a de-oxidation step. The heat treatment step occurs between the oxidation step and the de-oxidation step. The oxidation step is preferably performed at a temperature lying in the range of about 700° C. to 1100° C. The oxidation step may be performed by utilizing a dry technique or by a wet technique. In the dry technique, the oxidation step is performed, for example, by heating the wafer 50 under gaseous oxygen. In the wet technique, the oxidation step is performed, for example, by heating the wafer 50 in an atmosphere charged with steam. In both the dry technique and the wet technique, in conventional methods known to the person skilled in the art, the oxidizing atmosphere may also be charged with hydrochloric acid. The oxidation step leads to an oxide being formed that covers the surface 54 of the useful layer 52.

The heat treatment step may be conducted by using any heat treatment operation serving to improve the qualities of the material of the useful layer 52. The heat treatment step may be performed at constant temperature or by varying the temperature. For example, heat treatment may be performed by progressively raising the temperature between two values, or by controlling the temperature to oscillate cyclically between two values, and the like. The heat treatment step is preferably performed at least in part at a temperature higher than 1000° C., and more particularly around 1100° C. to 1200° C. This heat treatment step is preferably performed under a non-oxidizing atmosphere, which may comprise argon, nitrogen, hydrogen, etc., or indeed a mixture of these gases. The heat treatment may also be performed in a vacuum. Also preferably, the oxidation step is performed prior to the heat treatment step. In this manner, the oxide protects the remainder of the useful layer during the heat treatment step and avoids the phenomenon of pitting. Pitting is a phenomenon that is well known to the skilled person and occurs at the surface of certain semiconductors when they are annealed under a non-oxidizing atmosphere such as nitrogen, argon, in a vacuum, etc. It occurs in particular with silicon when it is bare, i.e. when it is not covered by an oxide layer. In an advantageous variant, the oxidation step begins at the beginning of the rise in temperature of the heat treatment step and it terminates before the end of the heat treatment.

The heat treatment step serves to cure at least in part the defects generated during the preceding stages in the method of fabricating and treating the wafer 50. More particularly, the heat treatment may be performed for a duration and at a temperature to enable it to cure crystal defects, such as stacking defects, "HF" defects, and the like generated in the useful layer 52 during the oxidation step. The term "HF" defect is used to designate any defect whose presence is revealed by a decorative halo in the buried oxide situated under the useful layer 52 (when the wafer 50 is an SOI wafer obtained by a Smart-Cut® method), after the wafer has been treated in a bath of hydrofluoric acid. The heat treatment step also advantageously reinforces the bonding interface between the layer transferred during the transfer of the Smart-Cut® method and the supporting substrate.

The de-oxidation step is preferably performed in a solution. For example, the solution may be a hydrofluoric 10 acid solution at 10% or 20%. A few minutes suffice to remove one thousand to a few thousand angstroms of oxide when the wafer 50 is dipped in such a solution.

In a third variant, the stages of the second variant described above are preceded by an additional sacrificial oxidation stage of the surface of the wafer 50. This additional sacrificial oxidation stage (identical to that described above) preferably is combined with heat treatment. The stages of RTA under pure argon and of chemical-mechanical polishing in this variant are identical to those described for the other variants described above. As for the above-described sacrificial oxidation stage, the first and second sacrificial oxidation stages both comprise an oxidation step and a de-oxidation step. The first and second sacrificial oxidation stages and the heat treatment steps are analogous to those above.

In a fourth variant of the present method, the RTA stage using pure argon is followed by two sacrificial oxidation stages of the free surface of the wafer 50. These sacrificial oxidation stages are identical to those described above and are preferably combined with heat treatment steps as described above. In this variant, an additional chemical-mechanical polishing stage occurs between the two sacrificial oxidation stages.

In a fifth variant of the invention, two stages of RTA under pure argon are performed on the wafer 50, with a chemical-mechanical polishing stage occurring between these two RTA stages.

In a sixth variant of the invention, a sacrificial oxidation stage is performed on the surface of the wafer 50 (which stage is identical to those described above, and is preferably combined with a heat treatment step), after which the wafer 50 is subjected to RTA under an atmosphere of pure argon.

In a seventh variant of the invention, the order of the two main stages of the sixth variant is reversed, with the RTA stage using pure argon being performed before the sacrificial oxidation stage.

In an eighth variant of the invention, between two stages of sacrificial oxidation of the surface of the wafer 50 (which stages are identical with those described above, and preferably combined with heat treatment steps), there is a RTA stage under pure argon.

To further improve the homogeneity of roughness on a free surface of a wafer, a ninth variant preferably includes a preliminary treatment of chemically cleaning the free surface of the wafer to eliminate or reduce pollutants thereon prior to performing RTA treatment in a pure argon atmosphere. It was found that without such a preliminary treatment, the RTA produces, in some instances, a free surface having some regions with slightly higher roughness compared to other regions of the surface. In particular, such "rougher" regions were typically located in the center portion of the wafer surface.

Surprisingly, it was discovered that the variations in roughness are due to pollutants on the surface of the wafer that are present before performing the RTA. The term "pollutant," as used herein, should generally be understood to refer to elements or other impurities present on an free surface of a wafer that can cause variations in surface roughness after RTA in a pure argon atmosphere. For example, such pollutants can include native oxide or hydrocarbons. Therefore, the chemical cleaning is preferably performed prior to, and more preferably performed immediately prior to, introducing the wafer into the annealing chamber. Preferably, the cleaning is an RCA cleaning or an HF cleaning.

Cleaning by RCA includes subjecting the free surface of a wafer to two successive chemical baths. The first bath includes an SC1 aqueous solution of ammonium hydroxide and hydrogen peroxide, preferably both in a concentration of at least about 0.5% and more preferably of at least about 1% based on molecular weight. The maximum concentration of both solutions is preferably at most about 10% and more preferably is at most about 5% based on molecular weight. For wafers whose free surfaces are made of silicon, for example SOI wafers, the first bath preferably includes about 1% ammonium hydroxide and about 2% hydrogen peroxide.

The second bath includes an SC2 aqueous solution of hydrogen chloride and hydrogen peroxide, preferably both in a concentration of at least about 0.05% and more preferably of at least about 0.1% based on molecular weight. The maximum concentration of both solutions is preferably at most about 5% and more preferably is at most about 1% based on molecular weight. For wafers whose free surfaces are made of silicon, the second bath preferably includes about 1% hydrogen chloride and about 1% hydrogen peroxide.

During RCA cleaning, the first and second baths are preferably kept at a temperature of at least about 10° C. and more preferably of at least about 20° C. Preferably, the temperature of the baths is at most about 100° C. and more preferably is at most about 80° C. For wafers whose free surfaces are made of silicon, the temperature of the first and second baths is preferably at least about 60° C. and at most about 80° C., and more preferably is about 70° C.

Cleaning the free surface of a wafer by HF cleaning is particularly effective in etching native silicon oxide from a silicon surface of a wafer, for example SOI. Preferably, the concentration of hydrofluoric acid is at least about 0.1% and more preferably is at least about 10% based on molecular weight. Preferably, the concentration of hydrofluoric acid is at most about 50% and more preferably is at most about 40% based on molecular weight. Even more preferably, the concentration of hydrofluoric acid is about 20%. Additionally, the HF cleaning is preferably carried out at a temperature of at least about 15° C. and at most about 25° C. More preferably, the HF cleaning is performed at about room temperature, or at about 20° C.

Both RCA and HF cleaning can be followed by a rinsing step to remove any used solution or loose pollutants from the free surface of the wafer. In the preferred embodiment, however, no rinsing is performed if HF cleaning is employed.

In the case where the wafer to be cleaned includes a free surface layer made of silicon germanium, the concentration of germanium in the surface layer should preferably be no more than about 30% by volume and more preferably no more than about 20% by volume. For cleaning silicon-germanium-on-insulator (SGOI) wafers in particular, chemical cleaning by RCA, HF, or any other means should generally be less aggressive as compared to cleaning SOI wafers. For example, the concentrations of the cleaning agents in aqueous solution and/or the temperatures of the aqueous solutions are preferably reduced.

To further improve the homogeneity and prevent or reduce the occurrence of a non-uniform distribution of roughness on the free surface of the wafer, a tenth variant of the invention preferably includes a preliminary treatment of replacing the initial atmosphere of the annealing chamber with a controlled atmosphere, and exposing the free wafer surface to a controlled atmosphere prior to performing the RTA in a pure argon atmosphere.

Figure 3:
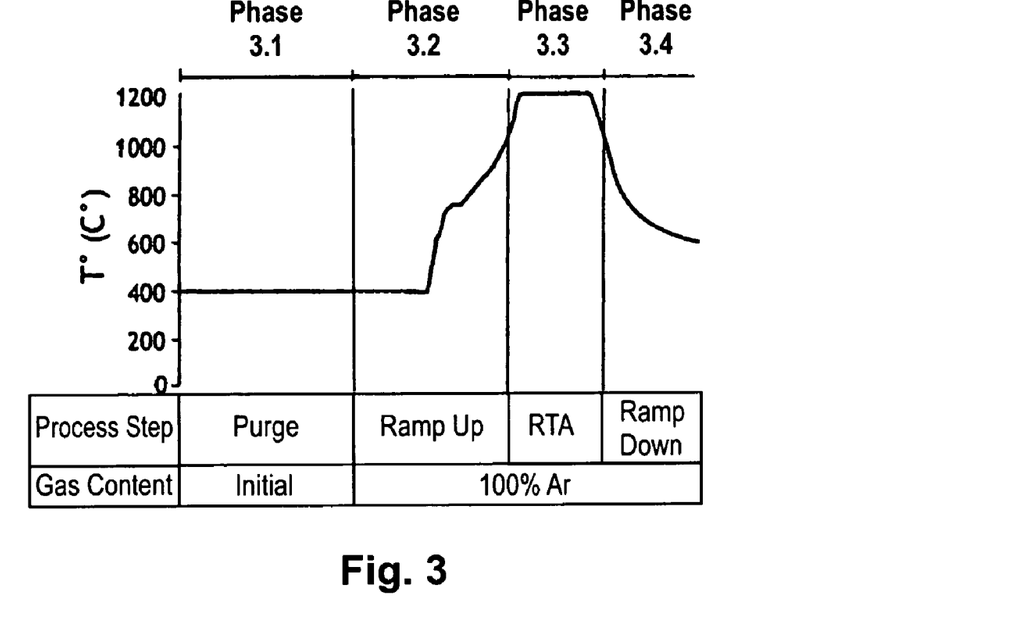
FIG. 3 is a graph illustrating the temperature profile in a typical RTA treatment using a pure argon atmosphere.

FIG. 3 shows a temperature profile of an annealing chamber during different steps of an RTA treatment in a pure argon atmosphere, without a preliminary treatment. The RTA treatment includes an initial phase 3.1, comprising a purge or removal of the initial atmosphere of the chamber after the wafer is placed therein and the gate is closed. Advantageously, purging the initial atmosphere of the chamber evacuates substantially all undesirable gases therefrom. As a result, the atmosphere that is present within annealing chamber just after the wafer is inserted is evacuated, and a pure argon atmosphere is then established.

A ramp-up phase 3.2 includes a ramp-up in temperature from an initial "cold" temperature within the chamber. Preferably, the ramp-up includes two steps. In the first step, the cold temperature is preferably less than about 400° C. and is preferably ramped-up or increased to a pre-stabilization temperature of at least about 650° C. and at most about 850° C. More preferably, the pre-stabilization temperature is about 750° C. During a second step of the ramp-up, the pre-stabilization temperature is ramped-up to the RTA temperature, preferably of at least about 1000° C. and more preferably of at least about 1150° C. The RTA temperature is preferably at most about 1300° C. and more preferably at most about 1230° C. After ramp-up phase 3.2, an annealing phase 3.3 includes performing the RTA on the wafer at the constant RTA temperature, followed by a cooling phase 3.4 wherein the temperature of the annealing chamber is allowed to cool.

Figure 4:
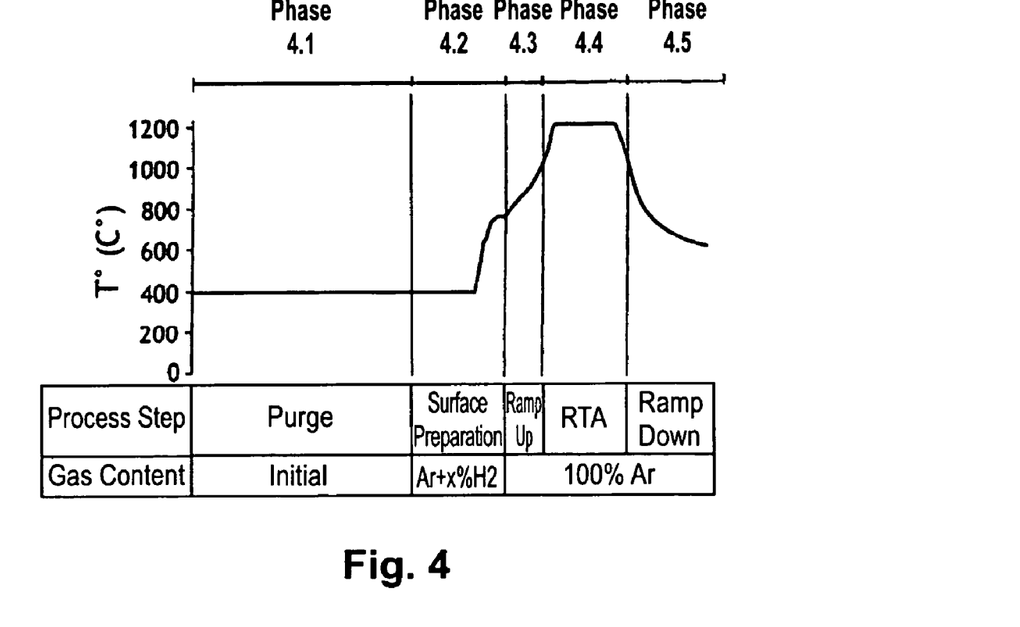
FIG. 4 is a graph illustrating the temperature profile in an embodiment of the present invention using a mixed-argon atmosphere.

FIG. 4 shows a temperature profile during one embodiment of an RTA treatment that includes a preliminary treatment of exposing the wafer to a controlled atmosphere. The initial phase 4.1 preferably includes a purge or removal of the initial atmosphere of the annealing chamber, as previously described. In phase 4.2, the initial atmosphere is replaced with a controlled atmosphere that preferably includes argon and a controlled proportion of at least one secondary gas to provide a mixed-argon atmosphere. Preferably, the secondary gas includes hydrogen and hydrogen chloride, or a combination thereof. In embodiments where the secondary gas is hydrogen, the controlled proportion is preferably at least about 0.5% by volume and more preferably is at least about 5% by volume. The controlled proportion is preferably at most about 30% by volume and more preferably is at most about 20% by volume. In embodiments where the secondary gas is hydrogen chloride, the controlled proportion is preferably at least about 0.5% by volume and more preferably is at least about 1% by volume. The controlled proportion is preferably at most about 5% by volume and more preferably is at most about 3% by volume. In embodiments where the secondary gas is a combination of hydrogen and hydrogen chloride, the controlled proportion of the two gases is preferably at least about 0.5% and at most about 30% by volume, depending on the ratio of hydrogen to hydrogen chloride present in the secondary gas mixture. In the treatment shown in FIG. 4, the secondary gas is hydrogen. In other embodiments, the controlled atmosphere includes other gases that eliminate or substantially reduce the amount of pollutants of the free surface of the wafer.

The phase 4.2 also includes a raise in temperature to the pre-stabilization temperature preferably of at least about 650° C. and at most about 850° C., and more preferably about 750° C. While this temperature is too low to facilitate smoothing, it does eliminate or significantly reduce the amount of pollutants, particularly native oxide, on the free surface of the wafer. The phase 4.2 does not correspond to a pre-annealing treatment because the cold temperature of the annealing chamber, preferably about 400° C., is relatively low. Rather, it is generally considered a controlled purge phase. In other embodiments, the phase 4.2 can be carried out at a temperature between about 100° C. and about 400° C.

Once the pre-stabilization temperature has been reached, the atmosphere of the annealing chamber is preferably purged or otherwise changed during phase 4.3 to effectively eliminate the mixed-argon atmosphere, including all of substantially all secondary gas, and replace it with a pure argon atmosphere. The pure argon atmosphere is then ramped-up during phase 4.3 to the RTA temperature preferably of at least about 1000° C. and more preferably of at least about 1150° C. The RTA temperature is preferably at most about 1300° C. and more preferably is at most about 1230° C. An intermediate phase 4.4 includes performing the RTA on the wafer at the constant RTA temperature in a pure argon atmosphere preferably for at least about 0.5 seconds, more preferably for at least about 1 second, and even more preferably for at least about 5 seconds. Preferably, the RTA is performed for at most about 60 seconds, more preferably for at most about 30 seconds, and even more preferably for at most about 10 seconds. The RTA is followed by a ramp down phase 4.5 wherein the temperature of the annealing chamber is allowed to cool.

Table 1 shows the surface roughness (according to three different scanned surface areas) of two SOI wafers after RTA treatment in a pure argon atmosphere.

TABLE 1

|  | AFM ROUGHNESS (Å rms) | | |
| --- | --- | --- | --- |
|  | 2 µm² | 10 µm² | 40 µm² |
| Wafer #1: Standard Roughness Regions | 1.5 | 5 | 7 |
| Wafer #1: High Roughness Regions | 6.2 | 11.7 | 13.7 |
| Wafer #2: Entire Wafer Surface | 1.5 | 5 | 7 |

Wafer #1 was not subjected to a preliminary treatment to eliminate or significantly reduce pollutants from its exposed surface while wafer #2 was subjected to such a treatment. As shown in the table, wafer #1 includes regions that have a lower surface roughness (i.e., 1.5 Å, 5 Å, and 7 Å) compared to other regions of wafer #1 that have a relatively a high surface roughness (i.e., 6.2 Å, 11.7 Å, and 13.7 Å). In contrast, the entire surface of wafer #2 exhibits a uniform low surface roughness (i.e., 1.5 Å, 5 Å, and 7 Å).

Figure 5:
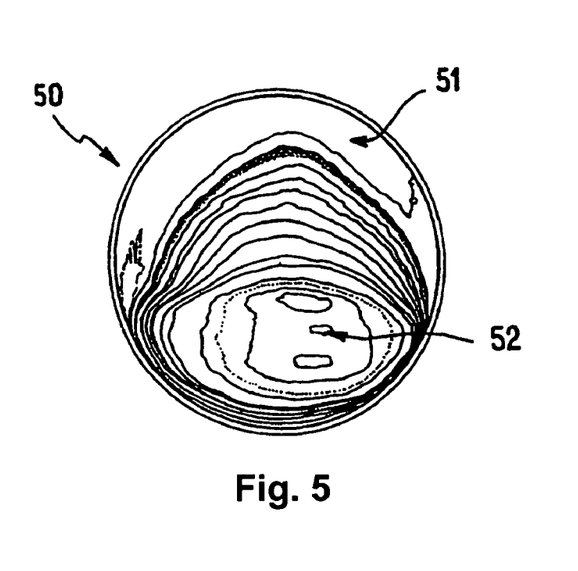
FIG. 5 is a top view of a surface of a wafer after RTA in a pure argon atmosphere without preliminary treatment.
Figure 6:
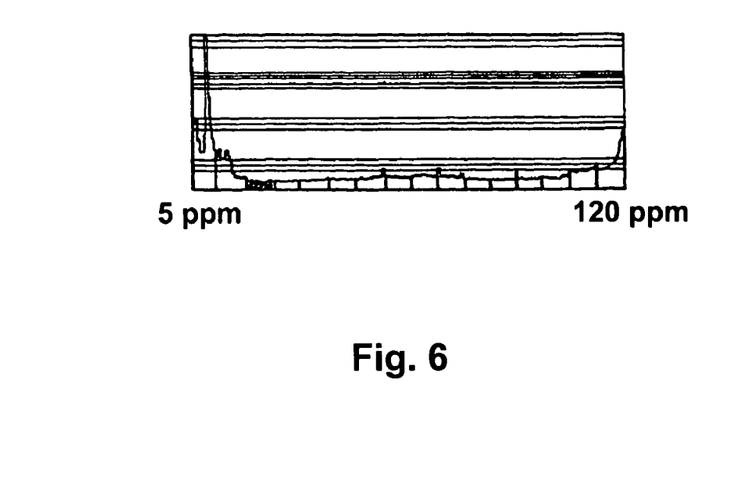
FIG. 6 illustrates the roughness distribution thereof.
Figure 7:
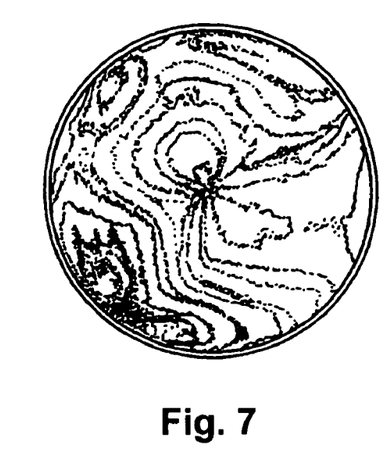
FIG. 7 is a top view of a surface of a wafer after RTA in a pure argon atmosphere with preliminary treatment according to an embodiment of the present invention.
Figure 8:
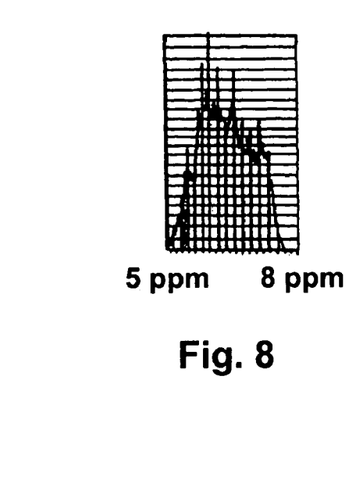
FIG. 8 illustrates the roughness distribution thereof.

FIGS. 5-6 and 7-8 illustrate, respectively, the roughness distribution over the surface of wafer #1 and wafer #2 after the RTA treatment. FIGS. 5 and 7 show the haze repartition over a scanned area of the surface of each wafer, and FIGS. 6 and 8 are corresponding histograms that show the distribution of haze values over the scanned area of each wafer surface. Specifically, FIG. 5 shows the surface of wafer #1, after RTA treatment but without a preliminary treatment, that has a region of increased roughness 52 located in the lower, central part of the wafer 50. The surface of wafer #1 also has a region of relatively low roughness 51. Wafer #1 thus has a wide distribution of surface roughness as measured in particles per million (ppm), for example 5 ppm to 120 ppm, as is depicted in the histogram of FIG. 6.

In contrast, FIG. 7 shows the surface of wafer #2, after both RTA and a preliminary treatment in a mixed-argon atmosphere, that does not have significant variations in surface roughness. Instead, the surface of the wafer exhibits a low surface roughness that is evenly distributed thereon. FIG. 8 shows that the surface roughness of wafer #2 varies only between 5 ppm and 8 ppm, which is a narrower and lower range than the surface variations of wafer #1. Thus, performing a preliminary treatment with a mixed-argon atmosphere prior to the RTA in a pure argon atmosphere advantageously provides a significant improvement in the homogeneity of reduced surface roughness of a wafer.

It should be observed that the different variants of the present method described above all make use of a single annealing operation for smoothing purposes. This single smoothing annealing operation corresponds to rapid thermal annealing under an atmosphere made up solely of pure argon.

Some of the variants may also make use of other types of annealing, but those annealing operations do not smooth the free surface of the wafer. In particular, the heat treatments associated with the sacrificial oxidation operations withdraw material and reinforce the bonding interfaces, and do not smooth the free surface of the wafer.

Although the sacrificial oxidation operations may have an effect on the roughness of the free surface of the wafer, it should be understood that this effect is not in any way comparable to that expected during a "smoothing" operation which seeks, as mentioned above, to reduce the low frequency roughness of the free surface of the wafer in a significant manner. Typically, low frequency roughness of the free surface of a wafer can be reduced by a factor of 1 to 2 by using a sacrificial oxidation technique, whereas when RTA is used the reduction is of the order of a factor of 10 (in this respect reference can be made to the table on page 19 of PCT application WO01/15215).

Moreover, the teaching relating to using heat treatments associated with sacrificial oxidation satisfy a need that is quite different from the goal of smoothing a free surface. In particular, the teaching of U.S. Pat. No. 6,403,450 relating to such heat treatments included in a sacrificial oxidation operation and mentioning the possibility of using an atmosphere of argon is not analogous to the present method wherein an essential element lies in the heat treatment in the RTA stage. Thus, a characteristic, which is essential and common to all of the variants described above, is that only a single smoothing annealing operation is implemented in the form of rapid thermal annealing under an atmosphere made up exclusively of pure argon to reduce free surface roughness.

The term "about," as used herein, should generally be understood to refer to both the corresponding number and a range of numbers. Moreover, all numerical ranges herein should be understood to include each whole integer within the range.

While illustrative embodiments of the invention are disclosed herein, it will be appreciated that numerous modifications and other embodiments can be devised by those of ordinary skill in the art. Features of the embodiments described herein can be combined, separated, interchanged, and/or rearranged to generate other embodiments. Therefore, it will be understood that the appended claims are intended to cover all such modifications and embodiments that come within the spirit and scope of the present invention.

What is claimed is:

1. A method for reducing the roughness of a free surface of a semiconductor-on-insulator wafer by rapid thermal annealing, comprising:
    chemically cleaning the free surface of the semiconductor-on-insulator wafer to reduce the amount of pollutants thereon; and
    performing a first rapid thermal annealing on the cleaned semiconductor-on-insulator wafer in a pure argon atmosphere to substantially reduce the roughness of the free surface of the cleaned semiconductor-on-insulator wafer;
    wherein the chemical cleaning is performed immediately before placing the semiconductor-on-insulator wafer in an annealing chamber for performing the rapid thermal annealing to improve the effectiveness of the subsequent rapid thermal annealing in reducing the roughness of the free surface of the cleaned semiconductor-on-insulator wafer.

2. The method of claim 1, wherein the first rapid thermal annealing is performed as single treatment at a temperature of between about 1000° C. and about 1400° C.

3. The method of claim 1, wherein the first rapid thermal annealing is performed for about 1 second to about 60 seconds.

4. The method of claim 1, wherein the chemical cleaning is an HF cleaning comprising treating the semiconductor-on-insulator wafer in an HF bath that has a concentration of HF between about 0.1% and about 50% based on molecular weight and a temperature of between about 15° C. and about 25° C.

5. The method of claim 1, wherein the semiconductor-on-insulator wafer is a silicon-germanium-on-insulator wafer having a silicon germanium surface layer that comprises less than about 30% germanium.

6. The method of claim 1, wherein the semiconductor-on-insulator wafer is prepared by:

implanting atomic species in a donor substrate to form a region of weakness therein;

bonding a handle substrate to the donor substrate to form a bonded structure, such that the region of weakness defines on opposite sides thereof the semiconductor-on-insulator wafer and another portion of the bonded structure, wherein the semiconductor-on-insulator wafer comprises the handle substrate and a transfer layer of the donor substrate; and applying energy at the region of weakness to detach the semiconductor-on-insulator wafer from the other portion and to provide the free surface on the transfer layer;

wherein the chemically cleaning substantially eliminates pollutants on the free surface of the semiconductor-on-insulator wafer.

7. The method of claim 1, further comprising establishing a first atmosphere in an annealing chamber;

replacing the first atmosphere with a second atmosphere that comprises a gas selected to eliminate or substantially reduce pollutants on the semiconductor-on-insulator wafer;

exposing the free surface of the semiconductor-on-insulator wafer to the second atmosphere to eliminate or substantially reduce pollutants thereon; and replacing the second atmosphere with the pure argon atmosphere for performing the first rapid thermal annealing on the semiconductor-on-insulator wafer.

8. The method of claim 1, wherein the chemical cleaning is an RCA cleaning comprising treating the semiconductor-on-insulator wafer in two successive chemical baths, wherein:

the first bath comprises an aqueous solution of ammonium hydroxide and hydrogen peroxide both in concentrations between about 0.5% and about 10% based on molecular weight;

the second bath comprises an aqueous solution of hydrogen chloride and hydrogen peroxide both in concentrations between about 0.05% and about 10% based on molecular weight; and the first and second baths have a temperature of between about 10° C. and about 100° C.

9. The method of claim 8, wherein the free surface of the semiconductor-on-insulator wafer comprises silicon, and:

the first bath comprises ammonium hydroxide and hydrogen peroxide in concentrations, respectively, of about 1% and about 2% based on molecular weight;

the second bath comprises hydrogen chloride and hydrogen peroxide both in concentrations of about 1% based on molecular weight; and the first and second baths have a temperature of between about 60° C. and about 80° C.

10. The method of claim 1, which further comprises removing material from the cleaned surface of the semiconductor-on-insulator wafer by performing at least a first sacrificial oxidation treatment.

11. The method of claim 10, wherein the first sacrificial oxidation treatment comprises:

heating the semiconductor-on-insulator wafer in an oxygen atmosphere to form an oxide layer on the free surface of the semiconductor-on-insulator wafer;

performing a heat treatment step to cure defects on the free surface of the semiconductor-on-insulator wafer; and removing at least a portion of the oxide layer from the free surface of the semiconductor-on-insulator wafer.

12. The method of claim 10, further comprising removing additional material from the cleaned surface by performing a second sacrificial oxidation treatment on the cleaned surface of the semiconductor-on-insulator wafer after performing the first rapid thermal annealing.

13. The method of claim 10, further comprising:

performing a second rapid thermal annealing on the cleaned semiconductor-on-insulator wafer after performing the first rapid thermal annealing; and polishing the free surface of the semiconductor-on-insulator wafer before or after the first or second rapid thermal annealing.

14. A method for reducing the roughness of a free surface of a semiconductor-on-insulator wafer, comprising:

forming the semiconductor-on-insulator wafer by:

implanting atomic species in a donor substrate to form a region of weakness therein;

bonding a handle substrate to the donor substrate to form a bonded structure, such that the region of weakness defines on opposite sides thereof the semiconductor-on-insulator wafer and another portion of the bonded structure, wherein the semiconductor-on-insulator wafer comprises the handle substrate and a transfer layer of the donor substrate;

applying energy at the region of weakness to detach the semiconductor-on-insulator wafer from the other portion and to provide the free surface on the transfer layer;

chemically cleaning the free surface of the transfer layer of the semiconductor-on-insulator wafer to reduce the amount of pollutants thereon; and performing rapid thermal annealing on the cleaned surface of the semiconductor-on-insulator wafer in a pure argon atmosphere to substantially reduce the roughness of the free surface of the semiconductor-on-insulator wafer;

wherein the chemical cleaning is performed immediately before placing the semiconductor-on-insulator wafer in an annealing chamber for performing the rapid thermal annealing to improve the effectiveness of the subsequent rapid thermal annealing in reducing the roughness of the free surface of the cleaned semiconductor-on-insulator wafer.

15. The method of claim 14, wherein the chemical cleaning is an HF cleaning comprising treating the semiconductor-on-insulator wafer in an HF bath that has a concentration of HF between about 0.1% and about 50% based on molecular weight and a temperature of between about 15° C. and about 25° C.

16. The method of claim 14, wherein the semiconductor-on-insulator wafer is a silicon-germanium-on-insulator wafer having a silicon germanium surface layer that comprises less than about 30% germanium.

17. The method of claim 14, wherein the first rapid thermal annealing is performed as single treatment at a temperature of between about 1000° C. and about 1400° C.

18. The method of claim 17, wherein the first rapid thermal annealing is performed for about 1 second to about 60 seconds.

19. The method of claim 14, wherein the chemical cleaning is an RCA cleaning comprising treating the semiconductor-on-insulator wafer in two successive chemical baths, wherein:

the first bath comprises an aqueous solution of ammonium hydroxide and hydrogen peroxide both in concentrations between about 0.5% and about 10% based on molecular weight;

the second bath comprises an aqueous solution of hydrogen chloride and hydrogen peroxide both in concentrations between about 0.05% and about 10% based on molecular weight; and the first and second baths have a temperature of between about 10° C. and about 100° C.

20. The method of claim 19, wherein the free surface of the semiconductor-on-insulator wafer comprises silicon, and:

the first bath comprises ammonium hydroxide and hydrogen peroxide in concentrations, respectively, of about 1% and about 2% based on molecular weight;

the second bath comprises hydrogen chloride and hydrogen peroxide both in concentrations of about 1% based on molecular weight; and the first and second baths have a temperature of between about 60° C. and about 80° C.

\* \* \* \* \*

UNITED STATES PATENT AND TRADEMARK OFFICE
CERTIFICATE OF CORRECTION

PATENT NO. : 7,749,910 B2  Page 1 of 1
APPLICATION NO. : 11/189849
DATED : July 6, 2010
INVENTOR(S) : Neyret et al.

It is certified that error appears in the above-identified patent and that said Letters Patent is hereby corrected as shown below:

Page 2, under FOREIGN PATENT DOCUMENTS, after "JP" change "0732104" to
-- 07321042 --.

Column 15:
Line 16 (claim 7, line 1), after "comprising" delete "establishing";
Line 17 (claim 7, line 2), before "a first atmosphere" start a new subparagraph with -- establishing --; and
Line 26 (claim 7, line 11), after "sphere" insert the text from lines 27 and 28.
Claim 7 will then correctly appear as follows:
    7. The method of claim 1, further comprising
    establishing a first atmosphere in an annealing chamber;
    replacing the first atmosphere with a second atmosphere that comprises a gas selected to
      eliminate or substantially reduce pollutants on the semiconductor-on-insulator wafer;
    exposing the free surface of the semiconductor-on-insulator wafer to the second atmosphere to
      eliminate or substantially reduce pollutants thereon; and
    replacing the second atmosphere with the pure argon atmosphere for performing the first rapid
      thermal annealing on the semiconductor-on-insulator wafer.

Signed and Sealed this

Tenth Day of August, 2010

David J. Kappos
*Director of the United States Patent and Trademark Office*